(12) United States Patent
Lin et al.

(10) Patent No.: US 12,543,422 B2
(45) Date of Patent: Feb. 3, 2026

(54) LIGHT EMITTING DEVICE

(71) Applicant: Quanzhou Sanan Semiconductor Technology Co., Ltd., Nanan (CN)

(72) Inventors: Qiuxia Lin, Xiamen (CN); Senpeng Huang, Xiamen (CN); Jian Liu, Xiamen (CN); Changchin Yu, Xiamen (CN); Chen-ke Hsu, Xiamen (CN)

(73) Assignee: QUANZHOU SANAN SEMICONDUCTOR TECHNOLOGY CO., LTD., Nanan (CN)

( * ) Notice: Subject to any disclaimer, the term of this patent is extended or adjusted under 35 U.S.C. 154(b) by 377 days.

(21) Appl. No.: 18/172,715

(22) Filed: Feb. 22, 2023

(65) Prior Publication Data

US 2023/0207766 A1    Jun. 29, 2023

Related U.S. Application Data

(63) Continuation-in-part of application No. PCT/CN2020/121238, filed on Oct. 15, 2020.

(51) Int. Cl.
*H10H 20/857* (2025.01)
*H10H 20/831* (2025.01)
(Continued)

(52) U.S. Cl.
CPC ...... *H10H 20/857* (2025.01); *H10H 20/8312* (2025.01); *H10H 20/8506* (2025.01); *H10H 20/853* (2025.01); *H10H 20/855* (2025.01)

(58) Field of Classification Search
CPC ............. H10H 20/857; H10H 20/8312; H10H 20/8506; H10H 20/853; H10H 20/855;
(Continued)

(56) References Cited

U.S. PATENT DOCUMENTS 9,831,220 B2 * 11/2017 Donofrio ............ H01L 25/0753
2016/0161098 A1 * 6/2016 Tudorica ................ H05B 45/56
362/249.14

FOREIGN PATENT DOCUMENTS

CN        202142529 U       2/2012
CN        103367586 A      10/2013
(Continued)

OTHER PUBLICATIONS

Search Report issued to PCT application No. PCT/CN2020/121238 on Jul. 14, 2021.

*Primary Examiner* — Jonathan Han
(74) *Attorney, Agent, or Firm* — MUNCY, GEISSLER, OLDS & LOWE, P.C.

(57) ABSTRACT

A light emitting device includes a package substrate, a patterned conductive layer, an LED chip, and an encapsulation layer. The patterned conductive layer is located on top of the package substrate, and has an isolation region that separates the patterned conductive layer into a first region and a second region. The LED chip is located on top of the patterned conductive layer. The encapsulation layer covers the LED chip and the patterned conductive layer. The encapsulation layer forms an optical structure that corresponds to the LED chip in position and that has a lateral curved surface covering a side wall of the LED chip. When light emitted from the LED chip radiates through the optical structure, the light emitting device has a viewing angle exceeding 120°.

20 Claims, 9 Drawing Sheets

(51) Int. Cl.
*H10H 20/85* (2025.01)
*H10H 20/853* (2025.01)
*H10H 20/855* (2025.01)

(58) Field of Classification Search
CPC .. H10H 20/0362; H10H 20/84; H10H 20/036; H10H 20/0363; H01L 25/0753; H01L 25/167
See application file for complete search history.

(56) References Cited

FOREIGN PATENT DOCUMENTS

| | | | |
|---|---|---|---|
| CN | 105098024 | A | 11/2015 |
| CN | 111106225 | A | 5/2020 |
| CN | 111312068 | A | 6/2020 |
| JP | 2004228297 | A | 8/2004 |

* cited by examiner

LIGHT EMITTING DEVICE

CROSS-REFERENCE TO RELATED APPLICATION

This application is a continuation-in-part (CIP) of International Application No. PCT/CN/2020/121238, filed on Oct. 15, 2020.

FIELD

The disclosure relates to a light emitting device, and more particularly to an ultraviolet light emitting device.

BACKGROUND

Referring to FIG. 1, a conventional deep ultraviolet LED generally has a covered package structure that uses a ceramic bowl 11 as a supporting substrate, and a quartz glass as a cover. More specifically, a conventional deep ultraviolet LED chip 120 has a flip-chip structure and is either die-bonded with solder paste to the ceramic bowl 11 or attached via eutectic bonding. The ceramic bowl 11 includes a package substrate 111, a surrounding wall 112, and a cavity 113 cooperatively formed by the surrounding wall 112 and the package substrate 111. When the conventional deep ultraviolet LED chip is bonded to the ceramic bowl 11, a chip electrode of the conventional deep ultraviolet LED chip 120 is bonded to a substrate electrode 130 disposed in the cavity 113 of the ceramic bowl 11, and a quartz glass panel 140 is affixed to an opening of the ceramic bowl 11 to form a sealed cavity. However, because conventional ceramic bowls 11 have considerable thickness and the sealed cavity 113 is not a space efficient packaging structure, conventional deep ultraviolet LEDs are generally quite large relative to other LEDs. Additionally, viewing angles and light intensity distribution of conventional deep ultraviolet LEDs are not adjustable.

A quartz glass lens is generally installed on a light emitting side of the conventional deep ultraviolet LED to change viewing angles. However, this increases the thickness of the conventional deep ultraviolet LED, while also contributing to a higher cost.

SUMMARY

Therefore, an object of the disclosure is to provide a light emitting device that can alleviate at least one of the drawbacks of the prior art.

According to the disclosure, the light emitting device includes a package substrate, a patterned conductive layer, an LED chip, and an encapsulation layer. The package substrate has a first surface and a second surface that is opposite to the first surface. The patterned conductive layer is located on top of the first surface, and has an isolation region that separates the patterned conductive layer into at least a first region and a second region that are electrically insulated from each other. The LED chip is located on top of the patterned conductive layer, and has an upper surface, a lower surface opposite to the upper surface, a side wall, a first electrode disposed on the lower surface, and a second electrode disposed on the lower surface. The first electrode is electrically connected to the first region of the patterned conductive layer, the second electrode is electrically connected to the second region of the patterned conductive layer. The encapsulation layer covers the LED chip and the patterned conductive layer. The encapsulation layer forms an optical structure that corresponds to the LED chip in position. The optical structure has a lateral curved surface that corresponds in position to a side wall of the LED chip. When light emitted from the LED chip radiates through the optical structure of the encapsulation layer, the light emitting device has a viewing angle exceeding 120°.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
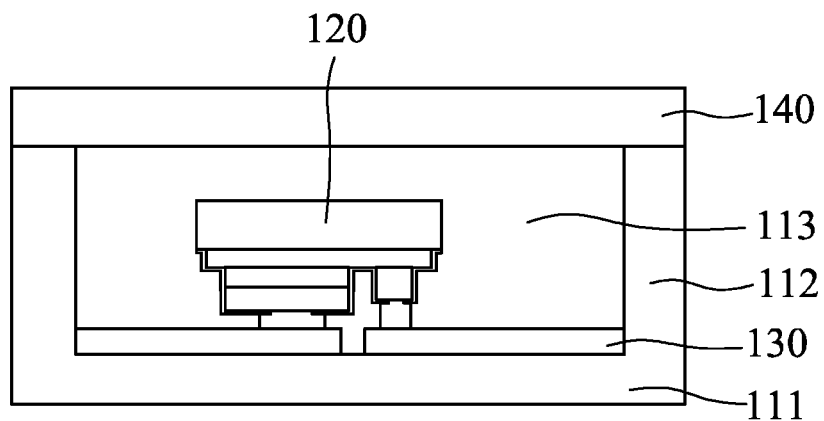
FIG. 1 is schematic view of a conventional light emitting device.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper,"

"lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
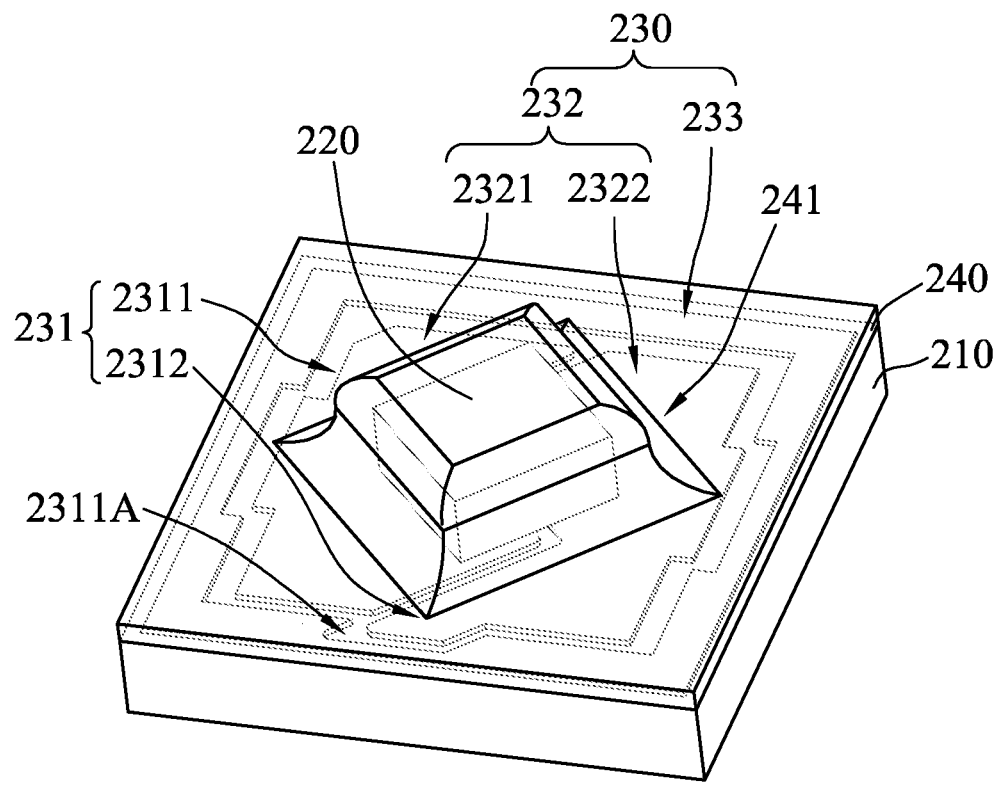
FIG. 2 is a schematic perspective view illustrating a first embodiment of a light emitting device according to the present disclosure.
Figure 4:
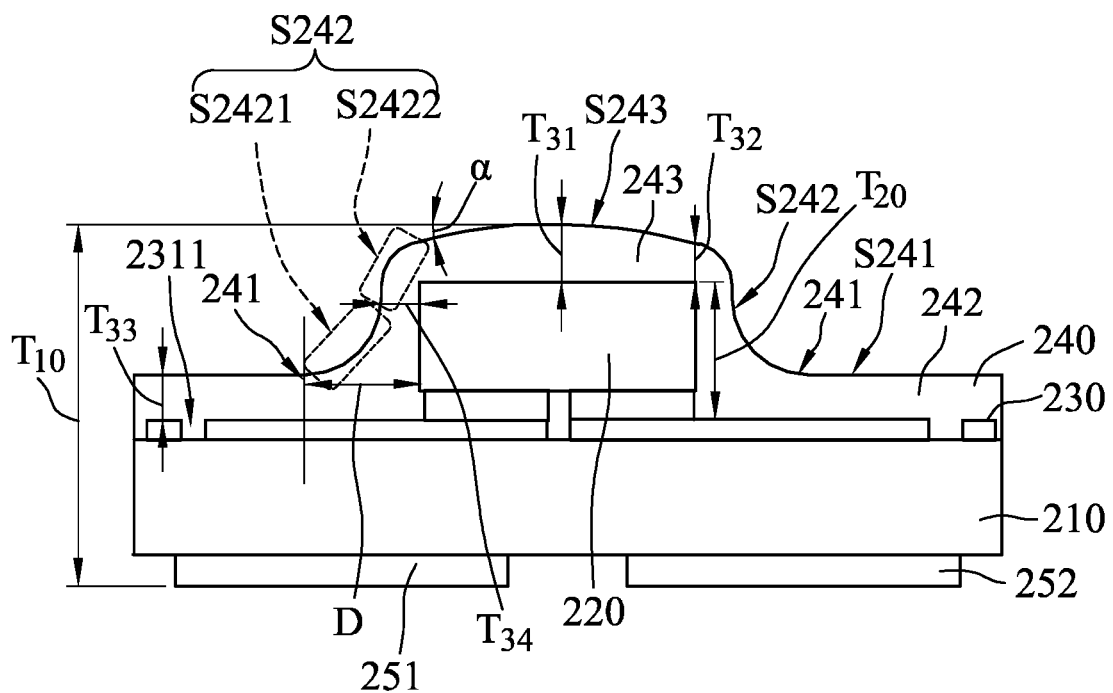
FIG. 4 is a schematic cross-sectional view illustrating the light emitting device shown in FIG. 2.

Referring to FIG. 2 and FIG. 4, a first embodiment of a light emitting device according to the present disclosure is shown. The light emitting device includes a package substrate 210, a patterned conductive layer 230 located on top of the package substrate 210, an LED chip 220 located above the package substrate 210 on top of the patterned conductive layer 230 and electrically connected to the patterned conductive layer 230, and an encapsulation layer 240 covering the LED chip 220 and the patterned conductive layer 230. The encapsulation layer 240 forms an optical structure that corresponds to the LED chip 220 in position. The optical structure has a lateral curved surface S242 that covers a side wall of the LED chip 220 and that is used for adjusting the viewing angle and the light intensity distribution of the light emitting device.

More specifically, the package substrate 210 has a first surface and a second surface that is opposite to the first surface. The package substrate 210 may be made of a material that is well known in the art, such as a ceramic material or a silicon material. In some embodiments, the package substrate 210 is a ceramic package substrate. The size of the package substrate 210 may be determined according to industry requirements, for example 35 mm×35 mm, 23 mm×19 mm or 13 mm×13 mm.

The patterned conductive layer 230 is located on top of the first surface of the package substrate 210, and has an isolation region 231 that separates the patterned conductive layer 230 into at least a first region 2321 and a second region 2322 that are electrically insulated from each other. In this embodiment, the isolation region 231 of the patterned conductive layer 230 is located on top of the first surface of the package substrate 210 and has a trench like structure. The trench like structure has a depth that is no less than a thickness of the patterned conductive layer 230, thereby allowing the first region 2321 and the second regions 2322 to be completely isolated from each other. The encapsulation layer 240 fills the trench like structure of the isolation region 231 in subsequent processes of fabricating the light emitting device. Referring to FIG. 4, the package substrate 210 has two external electrodes 251, 252.

In some embodiments, the isolation region 231 includes at least one first isolation section 2311 that extends along a periphery of the package substrate 210 on an outer peripheral area of the first surface, and that separates the patterned conductive layer 230 into a die bonding area 232 and a border area 233. The isolation region 231 further includes a second isolation section 2312 that is located in the die bonding area 232, and that separates the die bonding area 232 of the patterned conductive layer 230 into the first region 2321 and the second region 2322. The first isolation section 2311 is specified to be at a distance of 150 µm to 400 µm away from the periphery of the package substrate 210. This allows the encapsulation layer 240 and the package substrate 210 to have a stronger bond at a periphery of the encapsulation layer 240. In some preferred embodiments, the first isolation section 2311 has a closed loop configuration. Such a configuration may allow the border area 233 located on the periphery of the patterned conductive layer 230 to be completely electrically isolated from the die bonding area 232, which decreases the risk of current leakage in the light emitting device. Furthermore, the first isolation section 2311 may be filled by the encapsulation layer 240 to further strengthen the adhesion between the encapsulation layer 240 and the package substrate 210, which may decrease the chances of the encapsulation layer 240 separating from the package substrate 210 due to vibrations while undergoing transportation. Preferably the first isolation section 2311 has a width of 50 µm to 200 µm to ease filling of the encapsulation layer 240 into the first isolation section 2311. The isolation region 231 has a plurality of corners, at least one of the corners have an angle that is less than 90°. More specifically, in preferred embodiments, the first isolation section 2311 of the isolation region 231 has a corner 2311A that may be an acute angle, a right angle or an obtuse angle. The encapsulation layer 240 may be more tightly adhered to the package substrate 210 through the formation of the corner 2311A, especially when the corner 2311A is an acute angle which may form a hook-like structure. In some embodiments, the second isolation section 2312 may have corners 2311A which may be L-shaped or lightning bolt shaped.

Figure 3:
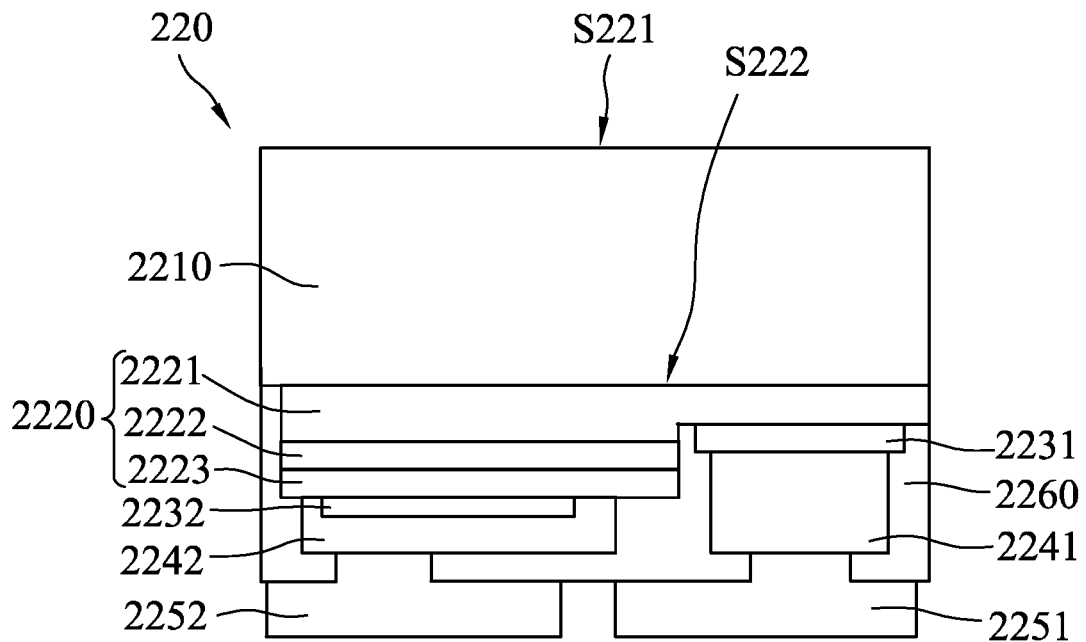
FIG. 3 is a schematic view illustrating an LED chip of the first embodiment.

The LED chip 220 is mounted to the die bonding area 232 of the patterned conductive layer 230 and located on top of the patterned conductive layer 230, and has an upper surface, a lower surface opposite to the upper surface, a side wall, a first electrode 2251 disposed on the lower surface, and a second electrode 2252 disposed on the lower surface. The first electrode 2251 is electrically connected to the first region 2321 of the patterned conductive layer 230. The second electrode 2252 is electrically connected to the second region 2322 of the patterned conductive layer 230. In some embodiments, the upper surface of the LED chip 220 and the first surface of the package substrate 210 are square or rectangular. An angle between a diagonal line of the upper surface of the LED chip 220, and a diagonal line of the first surface of the package substrate 210 is 45°. FIG. 3 shows the LED chip 220 alone before packaging. In some embodiments, the LED chip 220 has a flip chip structure, and may include a substrate 2210, and a semiconductor layer 2220. The substrate 2210 may be made of a material that facilitates epitaxial growth of the semiconductor layer 2220, and has a first surface S221 and a second surface S222 that is opposite to the first surface S221. The substrate 2210 may have a thickness that ranges from 100 µm to 500 µm. For example 200 µm to 250 µm, 250 µm to 300 µm, 300 µm to 400 µm or 400 µm to 500 µm. The semiconductor layer 2220 is located on the second surface S222 of the substrate 2210, and includes a first conductive semiconductor layer 2221, an active layer 2222, and a second conductive semiconductor layer 2223. In this embodiment, the active layer 2222 emits light with a wavelength that ranges from 200 nm to 365 nm. The semiconductor layer 2220 further includes a first ohmic contact layer 2231 that is located on the first conductive semiconductor layer 2221, and a second ohmic contact layer 2232 located on the second conductive semiconductor layer 2223. Additionally, the first electrode 2251 and the second electrode 2252 are respectively located on the first ohmic contact layer 2231 and the second ohmic contact layer 2232. Furthermore, an insulating layer 2260 is located between the first and second electrodes 2251, 2252, and a first conductive connecting layer 2241 and a second conductive connecting layer 2242 are respectively disposed between the first ohmic contact layer 2231 and the first electrode 2251 and between the second ohmic contact layer 2232 and the second electrode 2252. In some embodiments, the active layer 2222 of the LED chip 220 emits ultraviolet light with a wavelength below 365 nm. For example the wavelength may range from 285 nm to 320 nm, from 275 nm to 285 nm, or from 220 nm to 275 nm. In some embodiments, the LED chip 220 has a thickness ($T_{20}$) that is greater than 150 μm. However, it should be noted that the thickness ($T_{20}$) of the LED chip 220 should be selected to match its size. For example, on a small to medium sized LED chip 220, the thickness ($T_{20}$) should be greater than 200 μm, preferably 250 to 300 μm. On larger LED chips 220, the thickness ($T_{20}$) may be 400 μm to 600 μm, for example 420 μm to 450 μm. In any case, by increasing the thickness of the substrate 2210 in proportion to the size of the LED chip 220, the light emission efficiency of the LED chip 220 may be increased.

The encapsulation layer 240 covers the upper surface of the LED chip 220, extends to the first surface of the package substrate 210 and covers the first surface of the package substrate 210 completely. The periphery of the encapsulation layer 240 is either aligned with the periphery of the package substrate 210 or covers the periphery of the package substrate 210 and extends onto the side wall of the package substrate 210. In some cases, the encapsulation layer 240 may even extend to the second surface of the package substrate 210. In preferred embodiments, the encapsulation layer 240 is made of packaging material that includes fluororesin. The fluororesin may be a copolymer that contains fluorine or fluorocarbon compounds, however this is not a limitation of the present disclosure. Usable fluororesins may include, but not limited to, ethylenetetrafluoroethylene-hexafluoropropylene (EFEP), fluorinated ethylene propylene (FEP), perfluoroalkoxy alkane (PFA), ethylene tetrafluoroethylene (ETFE), polychlorotrifluoroethylene (PCTFE), polyvinyl fluoride (PVF), polytetrafluoroethylene (PTFE). In some embodiments, the fluororesin is FEP or PTFE. In the light emitting device according to the present disclosure, by virtue of using fluororesin for the encapsulation layer 240, the LED chip 220 may have higher light transmission, and higher light emission efficiency. Additionally, by virtue of having the encapsulation layer 240 completely cover the first surface of the package substrate 210, encapsulation of the LED chip 220 may be airtight and the encapsulation layer 240 may be tightly adhered to the package substrate 210, which increases the reliability of the light emitting device.

Referring to FIGS. 2 to 4, the encapsulation layer 240 has a planar region 242 that covers a portion of the patterned conductive layer 230 and surrounds the LED chip 220, and an elevated curved region 243 that is connected to the planar region 242, and that covers the LED chip 220. The elevated curved region 243 is located on regions of the encapsulation layer 240 that correspond to the upper surface and the side wall of the LED chip 220, and forms the optical structure. The optical structure has a dome-like shape. The planar region 242 and the elevated curved region 243 has an intersection 241. Specifically, the optical structure has the top surface S243 that is located directly above the upper surface of the LED chip 220, and the lateral curved surface S242 that is connected with the top surface S243 and that corresponds in position to the side wall of the LED chip. The top surface S243 may be flat or rounded. An inclining angle (α) of the top surface S243 of the optical structure with respect to a plane parallel to the upper surface of the LED chip 220 is between 0° to 40°. For example, in some embodiments the inclining angle (α) is between 5° to 20°, which facilitates the formation of a gently sloping lateral curved surface S242 on the upper surface of the LED chip 220, and allows the thickness of the encapsulation layer 240 to be more evenly distributed on top of the LED chip 220, thereby increasing light emission efficiency.

In this embodiment, a fluororesin thin film is adhered to the top of the LED chip 220 via a thin film lamination technique followed by heating to realize bonding between the LED chip 220 and the package substrate 210 and forming the a packaging layer i.e., the encapsulation layer 240, from the fluorine resin thin film. By adjusting the thickness of the encapsulation layer 240 to be in a range between 0.3 to 1.5 times a thickness ($T_{20}$) of the LED chip 220, the optical structure of the encapsulation layer 240 may be formed at a position that corresponds to the LED chip 220 and may have a particularly shaped configuration which is advantageous for improving the light pattern of light emitted by the LED chip 220. The encapsulation layer 240 has a first thickness (T31) directly above a center of the LED chip 220, and a second thickness (T32) above a periphery of the LED chip 220. The planar region 242 of the encapsulation layer 240 has a third thickness (T33). The planar region 242 of the encapsulation layer has a thickness ($T_{33}$) that is no greater than 1.5 times the thickness ($T_{20}$) of the LED chip 220. If the encapsulating layer 240 is not thick enough, the formation of the lateral curved surface S242 will be negatively affected, and additionally, may easily cause cracks on the LED chip 220, or even worse, may cause the encapsulation layer 240 separating from the LED chip 220. If the thickness of the encapsulation layer 240 is over twice the thickness ($T_{20}$) of the LED chip 220, after the encapsulation layer 240 is subjected to heating, it will be basically planar at regions distal from the periphery of the package substrate 210 and more difficult to form a curve shape for the optical structure. Additionally, the encapsulation layer 240 has light absorption properties, therefore a thicker encapsulation layer 240 will negatively affect the light emission efficiency of the LED chip 220.

Referring back to FIG. 4, the first thickness ($T_{31}$), the second thickness ($T_{32}$), and the third thickness ($T_{33}$) have the relation: 400 μm≥T33≥T31≥T32≥100 μm. The first thickness ($T_{31}$) of the encapsulation layer 240 that is directly above the LED chip 220 is relatively thin which increases the light extraction efficiency of the light emitting device, and the third thickness ($T_{33}$) that is above the planar region 242 of the encapsulation layer 240 is relatively thicker which increases the bonding strength between the encapsulation layer 240 and the package substrate 210. Therefore, there is no compromise made between the light extraction efficiency and the reliability of the light emitting device as both features are well accommodated. By having the second thickness ($T_{32}$) of the encapsulation layer 240 that is above the periphery of the LED chip 220 above 100 μm, the LED chip 220 may be better encapsulated by the encapsulation layer 240. More preferably, the second thickness ($T_{32}$) may be above 150 μm, so that the lateral curved surface S242 covering the side wall of the LED chip 220 may have a gentle slope, which facilitates the adjustment of the viewing angle and the light intensity distribution of the light emitting device. Furthermore, the first thickness ($T_{31}$) and the third thickness ($T_{33}$) may have the relation: 0 μm≤$T_{33}$-$T_{31}$≤50 μm, which reduces mechanical stress between the LED chip 220 and the encapsulation layer 240, and allows the LED chip 220 to be better encased by the encapsulation layer 240. It should be noted that FIG. 4 shows an embodiment where the first thickness ($T_{31}$) and the third thickness ($T_{33}$) are roughly the same.

Referring to FIG. 4, the thickness ($T_{20}$) of the LED chip 220 is no less than 300 μm, the first thickness ($T_{31}$) of the encapsulation layer 240 is no less than 150 μm, and additionally, the first thickness ($T_{31}$) is no greater than the thickness ($T_{20}$) of the LED chip 220 which may be expressed by the relation: 150 μm≤$T_{31}$≤T20. With these parameters, the LED chip 220 may be well encased by the encapsulation layer 240, the optical structure may have a well formed lateral curved surface S242, and the light emitting device may have a light emission efficiency. Furthermore, the first thickness ($T_{31}$) and the second thickness ($T_{32}$) may have the relation 0 µm<$T_{31}$-$T_{32}$≤100 µm, which may allow a portion of the encapsulation layer 240 covering the upper surface of the LED chip 220 to have a more uniform thickness, thereby facilitating a more even light intensity distribution of the LED chip 22. In some embodiments, the first thickness ($T_{31}$) is no greater than 0.8 times the thickness ($T_{20}$) of the LED chip 220 which may be expressed by the relation: 150 µm≤$T_{31}$≤0.8×$T_{20}$. In this embodiment, the first thickness ($T_{31}$), the second thickness ($T_{32}$), and the third thickness ($T_{33}$) is no less than 100 µm, but less than 200 µm, or no less than 200 µm but less than 300 µm, or no less than 300 µm but less than 400 µm. For example, the LED chip may have a thickness ($T_{20}$) of 420 µm and the encapsulation layer 240 may have a thicknesses (the first thickness ($T_{31}$), second thickness ($T_{32}$), and third thickness ($T_{33}$) ranging from 250 to 300 µm.

Referring to FIG. 4, the encapsulation layer 240 covering the side wall of the LED chip 220 gradually decreases in thickness along a height of the LED chip 220 from a bottom to a top of the side wall. Furthermore, the thickness ($T_{31}$) of the encapsulation layer 240 covering the upper surface of the LED chip 220 is less than the thickness ($T_{20}$) of the LED chip 220, and a portion of the encapsulation layer 240 covering a part of the side wall of the LED chip 220 adjacent to the upper surface of the LED chip 220 has a minimum thickness ($T_{34}$) which is ≥100 µm. If the minimum thickness ($T_{34}$) is less than 100 µm the LED chip 220 will not be well encased by the encapsulation layer 240, and may break or separate which will affect the encapsulation quality of the LED chip 220, more specifically, affect the airtightness of the encapsulation. Furthermore, the first thickness ($T_{31}$) is preferably between 1.25 to 2 times the thickness of the minimum thickness ($T_{34}$). By controlling the thickness of the encapsulation layer 240 over the side wall of the LED chip 220 an optical structure with an appropriate shape may be formed, which enables more uniform light pattern at the lateral side of the LED chip and better light focusing effect in a normal direction. In some embodiments, when the light emitted from the LED chip 220 radiates through the optical structure of the encapsulation layer 240, the light emitting device has a viewing angle exceeding 120°. For example the light emitting device may have a viewing angle ranging from 135° to 150°.

In some embodiments, the encapsulation layer 240 has a lower portion surrounding an outer periphery of the LED chip 220, and a higher portion formed above an upper surface (see claim 14) of the LED chip 220. The lateral curved surface S242 of the optical structure includes a first curved surface S2421, and a second curved surface S2422 that connects with the higher portion, i,e, the top surface S243 of the elevated curved region 243. The first curved surface 2421 covers the side wall of the LED chip 220 and is connected with the lower portion of the encapsulation layer 240. In other words, the first curved surface S2421 connects to the planar region 242 and is proximate to the planar region 242. The second curved surface S2422 has a first end that directly connects to a top of the first curved surface S2421 and a second end that is located above the upper surface of the LED chip 220. A distance (D) measured from an intersection 241 of the lateral curved surface S242 of the optical structure and the planar surface S241 of the planar region 242, to the side wall of the LED chip 220 is 1 to 2 times the thickness ($T_{20}$) of the LED chip 220. If the distance (D) is less than the thickness ($T_{20}$) of the LED chip 220, the LED chip 220 will not be well encapsulated by the encapsulation layer 240, and may separate or break and cause the encapsulation to lose airtightness. If the distance (D) is more than 2 times the thickness ($T_{20}$) of the LED chip 220, then light emission from the side wall of the LED chip 220 will be adversely affected and the light emission efficiency of the light emitting device will be compromised. In some embodiments, the third thickness ($T_{33}$) of the planar region 242 of the encapsulation layer 240 is 250 µm, the thickness ($T_{20}$) of the LED chip 220 is 430 µm, and the distance (D) is 500 µm.

Figure 5:
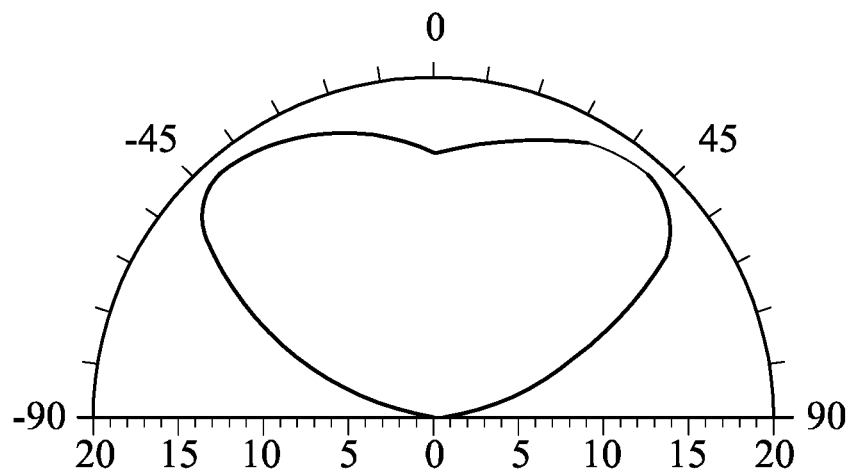
FIG. 5 is a light intensity distribution curve of the conventional light emitting device in FIG. 1.
Figure 6:
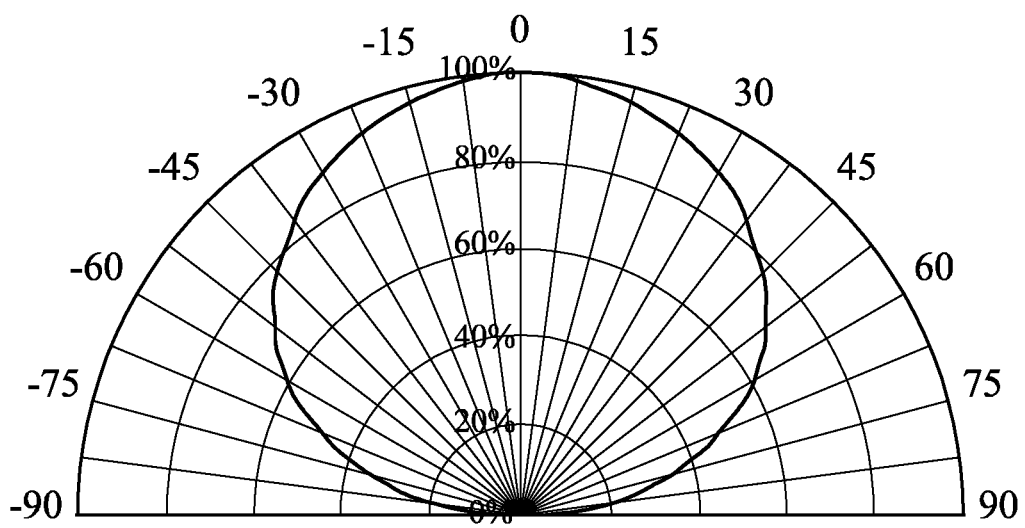
FIG. 6 is a light intensity distribution curve of the light emitting device according to the present disclosure.

FIG. 5 and FIG. 6 show luminous intensity distribution curves of the light emitting devices shown in FIGS. 1 and 2, respectively, which show light distribution in different directions. FIG. 5 shows that the conventional light emitting device has the most intense light emission at 30° to 45° off center to the normal direction of the distribution space. FIG. 6 shows the light distribution curve of the embodiment from FIG. 2 powered by a 350 ma power source, the LED chip 220 from this embodiment has a thickness ($T_{20}$) of around 420 µm, and the distance (D) measured from the intersection 241 of the lateral curved surface S242 of the optical structure and the planar surface S241 of the planar region 242 to the side wall of the LED chip 220 is 500 µm. From FIG. 6 it can be observed that the light distribution has a roughly oval shape and has the highest intensity at 0° off center to the normal direction of the distribution space, and the light distribution is more isotropic. The embodiment of the present disclosure as shown in FIG. 2, when compared to the conventional light emitting device, has the LED chip 220 encapsulated by the encapsulation layer 240 and the encapsulation layer 240 forming the optical structure. These elements allow the light intensity distribution of the light emitting device of the present disclosure to have an oval shaped pattern instead of the heart shaped pattern of the conventional light emitting device. The oval shaped pattern is close to a Lambertian light distribution and the light emitting device has a viewing angle of 140±5°.

In this embodiment, the LED chip 220 is disposed on the first surface of the package substrate 210, and the encapsulation layer 240 is formed on top of the package substrate 210 and the LED chip 220 via the thin film lamination process. The thin film lamination process forms the optical structure of the encapsulation layer 240 that corresponds to the LED chip 220 in position. This process allows the light emitting device to have a total thickness ($T_{10}$) of less than 2 mm, for example 1 mm to 1.5 mm. For example, the package substrate 210 may have a thickness of 500 µm, the LED chip 220 may have a thickness ($T_{20}$) of 450 µm, and the encapsulation layer 240 may have a first thickness ($T_{31}$) directly above a center of the LED chip 220 that is 250 µm. Therefore the total thickness ($T_{10}$) of the light emitting device is around 1200 µm.

In this embodiment, because the package substrate 210 is planar, and the LED chip 220 is packaged on the package substrate 210 via thin film lamination, the LED chip 220 can take up a relatively large area on the first surface of the package substrate 210 which may be above 10%. In one embodiment, the package substrate 210 has dimensions 35 mm×35 mm, and the patterned conductive layer 230 has the same design as the one shown in FIG. 2. The first surface of the package substrate 210 has a surface area of 12.25 mm²; while the LED chip 220 has dimensions of 50 mil×50 mil, and an upper surface with a surface area of 1.6 mm² which is roughly 13% of the surface area of the first surface of the package substrate 210. In other embodiments, the patterned conductive layer 230 may be altered by excluding the first isolation section 2311, or replacing the first isolation section 2311 with a straight isolation section. This will allow an increase in ratio of the area of the upper surface of the LED chip 220 to the area of the first surface of the package substrate 210.

Figure 7:
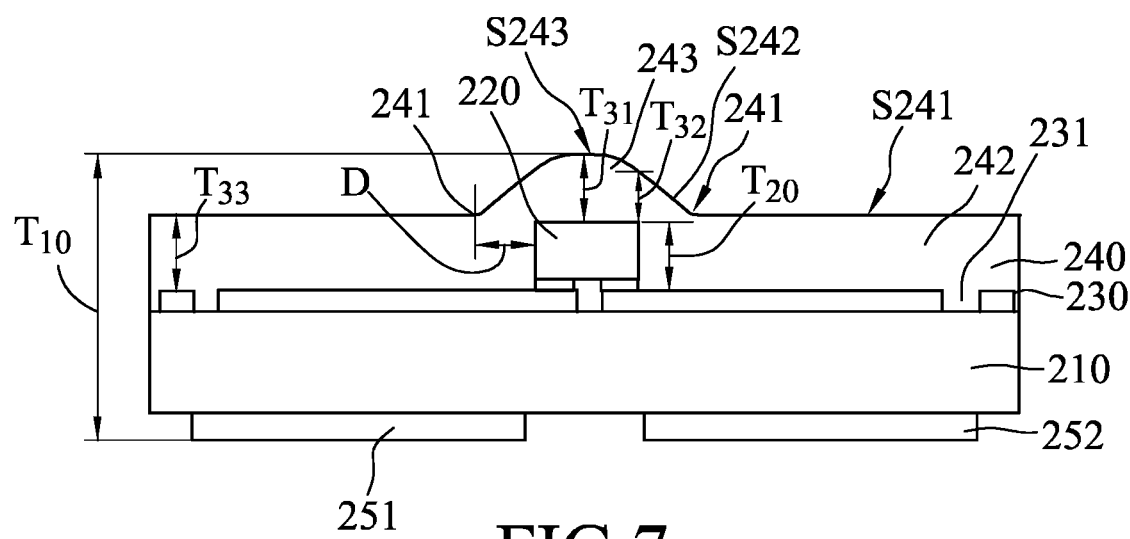
FIG. 7 is a schematic cross-sectional view illustrating a second embodiment of the light emitting device according to the present disclosure.

FIG. 7 shows a second embodiment of the light emitting device according to the present disclosure. In the embodiment shown in FIG. 4, the thickness ($T_{20}$) of the LED chip 220 is greater than 300 µm, the thickness ($T_{31}$) of the encapsulation layer 240 is smaller than the thickness ($T_{20}$) of the LED chip 220. In the second embodiment of the light emitting device, the thickness ($T_{20}$) of the LED chip 220 no greater than 300 µm. For example, the thickness ($T_{20}$) of the LED chip 220 may be 150 µm to 200 µm, or from 200 µm to 300 µm. Additionally, the thickness ($T_{31}$) of the encapsulation layer 240 above the upper surface of the LED chip 220 is no less than half the thickness ($T_{20}$) of the LED chip 220 and no greater than the thickness ($T_{20}$) of the LED chip 220. In another variation of the second embodiment, the thickness ($T_{31}$) of the encapsulation layer 240 above the upper surface of the LED chip 220 is no greater than 4/5 times the thickness ($T_{20}$) of the LED chip 220. In other variations of the second embodiment, the first thickness ($T_{31}$) of the encapsulation layer 240 and the thickness ($T_{20}$) of the LED chip 220 have the relation: $1.2 \times T_{20} \geq T_{31} \geq 0.5 \times T_{20}$, which will allow the encapsulation layer 240 to better encapsulate the LED chip 220, and facilitate the formation of the optical structure having the lateral curved surface S242. In an example, the first thickness ($T_{31}$) of the encapsulation layer 240 is almost similar to the thickness ($T_{20}$) of the LED chip 220, i.e., $T_{31} \approx T_{20}$. Furthermore, the first thickness ($T_{31}$) and the second thickness ($T_{32}$) of the encapsulation layer 240 may have the relation: $0\ \mu m \leq T_{31} - T_{32} \leq 50\ \mu m$, so that the encapsulation layer 240 is evenly encapsulating the LED chip 220 with a relatively uniform thickness. Furthermore, the thickness ($T_{30}$) of the encapsulation layer 240 is at least over 150 µm throughout. For example the thickness ($T_{30}$) of the encapsulation layer 240 may be no less than 150 µm but less than 200 µm, or no less than 200 µm but less than 300 µm. The LED chip 220 may have a thickness ($T_{20}$) that is 250 µm, and the first thickness ($T_{31}$) of the encapsulation layer 240 above the upper surface of the LED chip 220 is equal to or slightly thicker than the thickness ($T_{20}$) of the LED chip 220.

Referring to FIG. 7, in the second embodiment, the encapsulation layer 240 includes the elevated curved region 243 that forms the optical structure covering the LED chip 220. The encapsulation layer 240 further includes the planar region 242 that extends away from the outer periphery of the LED chip to cover the first surface of the package substrate 210 and to form a planar surface S241 of the planar region 242 above the patterned conductive layer 230. It should be noted that the encapsulation layer 240 fills the isolation region 231 of the patterned conductive layer 230. Therefore the flat surface S241 may form a ripple above the isolation region 231. The elevated curved region 243 (i.e., the optical structure) has the top surface S243 that is located directly above the upper surface of the LED chip 220, and the elevated curved region 243 has a generally spherical surface. The intersection 241 of the lateral curved surface S242 of the elevated curved region 243 and the planar surface S241 of the planar region 242 is proximate to or flush with the upper surface of the LED chip 220, or located slightly above the upper surface of the LED chip 220. A distance (D) measured from the intersection 241 to the side wall of the LED chip 220 is 1 to 2 times the thickness ($T_{20}$) of the LED chip 220.

When the distance (D) is less than the thickness ($T_{20}$) of the LED chip 220, the LED chip 220 will not be well encapsulated by the encapsulation layer 240, which may not offer good protection against breakage or damage and affect the air tightness of the encapsulation. When the distance (D) is over two times the thickness ($T_{20}$) of the LED chip 220, light emission from the lateral sides of the LED chip 220 will be impaired, and the light emission efficiency of the light emitting device will be negatively affected. In one embodiment, the encapsulation layer 240 has a third thickness ($T_{33}$) of 250 µm at the planar region 242, the thickness ($T_{20}$) of the LED chip is also 250 µm, and the distance (D) is approximately 300 µm. In another embodiment, the thickness ($T_{20}$) of the LED chip 220 and the first thickness ($T_{31}$) of the encapsulation layer 240 are both 250 µm. In this case, the LED chip 220 has a viewing angle of 130°, and the light intensity distribution curve thereof is generally as shown in FIG. 6. In other words, when light emitted by the LED chip 220 passes through the optical structure of the encapsulation layer 240, a viewing angle of this embodiment is 135°±5°. A light intensity distribution curve of this embodiment operating under 60 mA is similar to that shown in FIG. 6.

In the second embodiment, the thickness ($T_{31}$) of the encapsulation layer (240) is equal to or slightly greater than the thickness ($T_{20}$) of the LED chip 220, The lateral curved surface S242 of the optical structure is formed above the LED chip 220 (i.e., at a position corresponding to the side wall of the LED chip 220) may have a relatively gentle slope which ensures tight bonding between the LED chip 220 and the encapsulation layer 240.

Figure 8:
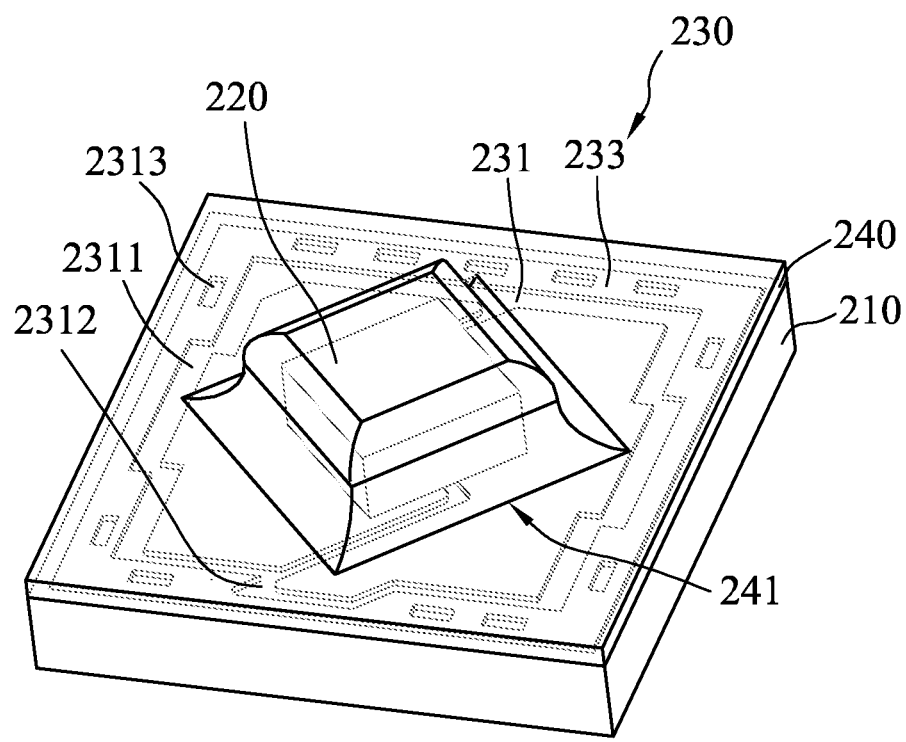
FIG. 8 is a schematic perspective view illustrating a third embodiment of the light emitting device according to the present disclosure.

Referring to FIG. 8, a third embodiment of the light emitting device according to the present disclosure is shown. In this embodiment, the patterned conductive layer 230 of the package substrate 210 has an auxiliary trench 2313. The auxiliary trench 2313 has a depth that is greater than half a thickness of the patterned conductive layer 230, or in other embodiments, the depth of the auxiliary trench 2313 may be greater than the thickness of the patterned conductive layer 230. The encapsulation layer 240 fills the auxiliary trench 2313 and increases the strength of the bonding between the encapsulation layer 240 and the package substrate 210.

Figure 9:
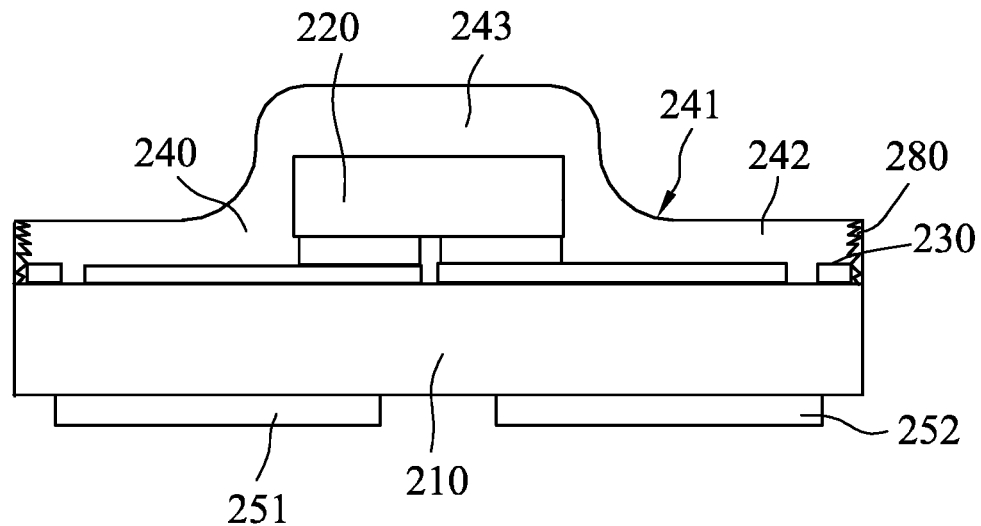
FIG. 9 is a schematic cross-sectional view illustrating a fourth embodiment of the light emitting device according to the present disclosure.

Referring to FIG. 9, a fourth embodiment of the light emitting device according to the present disclosure is shown. In this embodiment, a waterproof layer 280 is formed around the periphery of the encapsulation layer 240. The waterproof layer 280 may be made of a material such as silicone, an inorganic silicon compound, silicon dioxide or other materials. When packaging deep ultraviolet LED chips 220, the packaging material may contain fluorine which offers good UV light transmission and helps resist photodegradation, thereby improving the reliability of the light emitting device. However, because fluorine is non-adhesive, burring will occur on edges of the packaging material after dicing. In this embodiment, the encapsulation layer 240 includes fluorine which causes the encapsulation layer 240 to have burred edges. The burred edges may develop a tighter bond with a waterproof coating that is applied to the edges of the encapsulation layer 240 and that will later form the waterproof layer 280. This allows a tighter bond between the package substrate 210 and the encapsulation layer 240 and increase airtightness of lateral surfaces of the light emitting device which increase the service-life of the light emitting device. The waterproof layer 280 may have a thickness larger than or equal to the thickness of the encapsulation layer 240.

Figure 10:
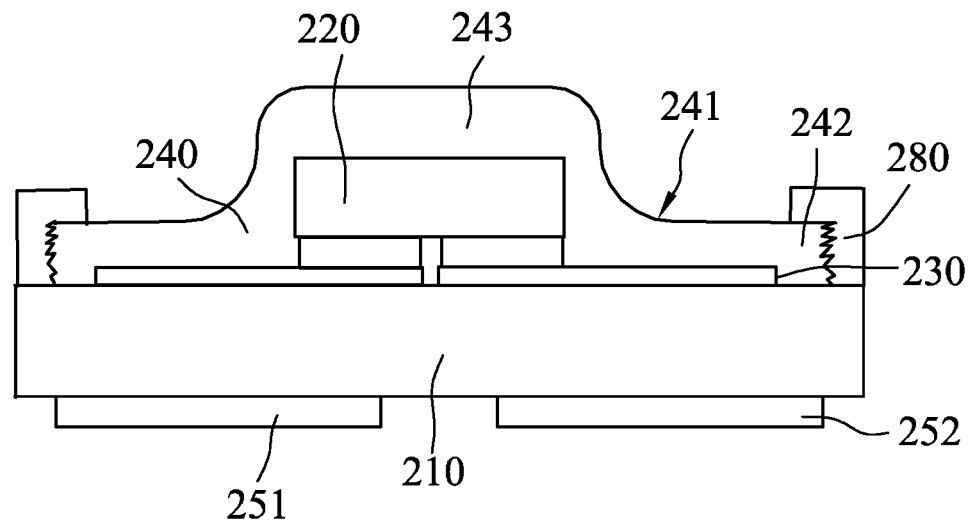
FIG. 10 is a schematic cross-sectional view showing a variant of the fourth embodiment.
Figure 11:
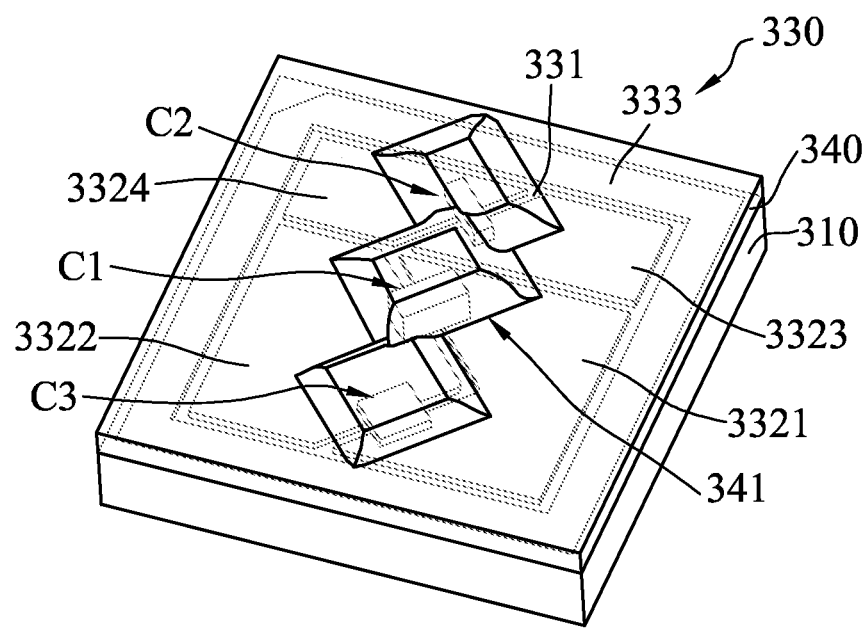
FIG. 11 is schematic perspective view illustrating a fifth embodiment of the light emitting device according to the present disclosure.

In one embodiment, the waterproof layer 280 has an inverted L-shaped cross section as shown in FIG. 10, the width of the encapsulation layer 240 is smaller than that of the package substrate 210, and the waterproof layer 280 is formed around an edge of the encapsulation layer 240 and is bonded to the package substrate 210. The waterproof layer 280 decreases the risk of moisture entering the LED chip 220 and increases reliability of the light emitting device.

Figure 12:
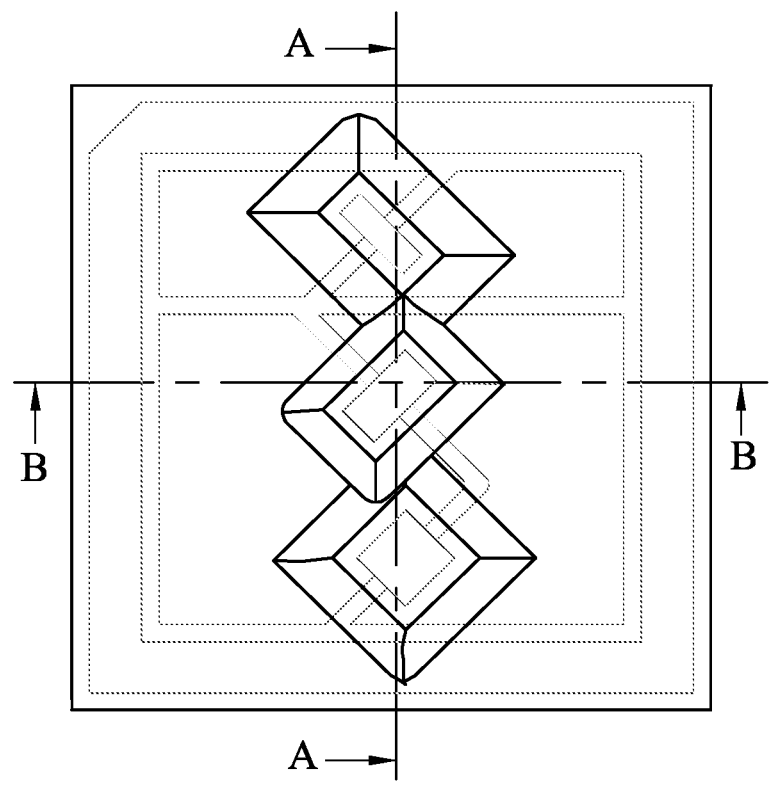
FIG. 12 is a schematic top view of the fifth embodiment.
Figure 13:
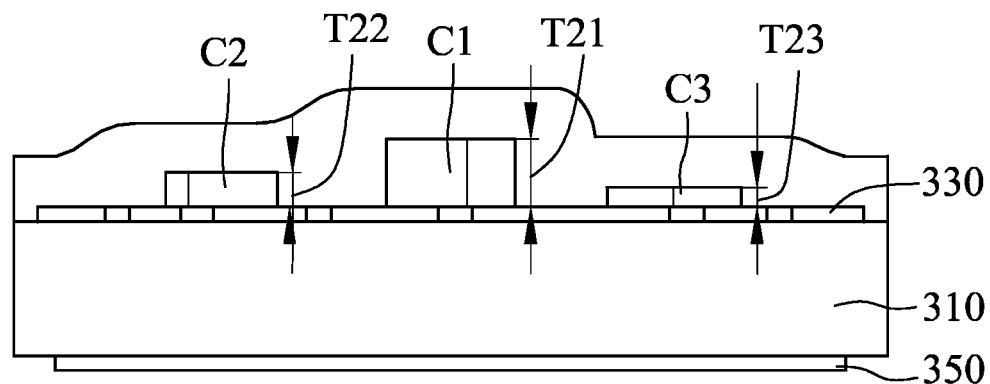
FIG. 13 is a schematic cross-sectional view of the fifth embodiment taken from line A-A in FIG. 12.

Referring to FIGS. 12, and 13, in some embodiments, the encapsulation layer 240 may have curved optical structures above LED chips as shown. However, in other embodiments, the encapsulation layer 240 is pressure molded, and the curved optical structures above the LED chips are omitted. In still other embodiments, the waterproof layer 280 may be formed on top of the encapsulation layer 240, or on side walls of the package substrate 210.

Referring to FIGS. 11 to 14, a fifth embodiment of the light emitting device according to the present disclosure is shown. The light emitting device includes a first LED chip (C1) and a second LED chip (C2), the first LED chip (C1) emits light with a wavelength under 285 nm, and the second LED chip (C2) emits light with a wavelength between 350 nm to 420 nm. In one embodiment, the first LED chip (C1) emits light with a wavelength of 270 nm which is mainly useful for sterilization, and the second LED chip (C2) emits light with a wavelength of 405 nm which is useful for photopolymerization. In other embodiments, the second LED chip (C2) may emit light at other wavelengths; for example, the second LED chip (C2) may emit red light useful for food preservation.

As shown in FIGS. 11 to 14, beside the first LED chip (C1) and the second LED chip (C2), the light emitting device includes an electro-static discharge (ESD) protection component (C3). The package substrate 310 of the fifth embodiment is similar to the package substrate 210 of the first embodiment, and a patterned conductive layer 330 is located on top of the first surface of the package substrate 310. In the fifth embodiment, the isolation region 331 separates the patterned conductive layer 330 into at least four isolation regions, namely, the first region 3321, the second region 3322, a third region 3323, and a fourth region 3324. In the fifth embodiment, the first LED chip (C1), the second LED chip (C2) and the ESD protection component (C3) are obliquely aligned on the package substrate 310. This decreases light absorption of adjacent LED chips. Furthermore, an external electrode is located on the second surface of the package substrate 310.

Figure 14:
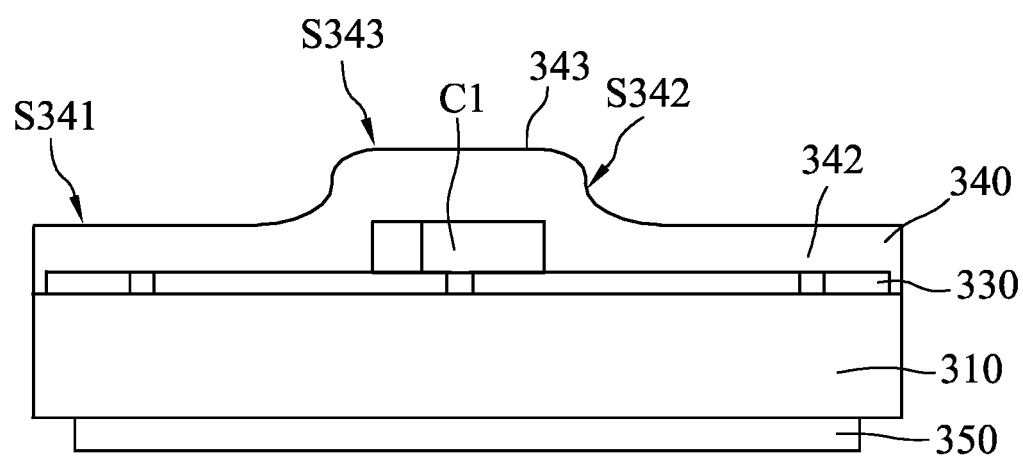
FIG. 14 is a schematic cross-sectional view of the fifth embodiment taken from line B-B in FIG. 13.

FIGS. 13 and 14 respectively show cross-sections of the embodiment in FIG. 12 taken along the lines A-A and B-B. In this embodiment, the first LED chip (C1), the second LED chip (C2), and the ESD protection component (C3) may have different thicknesses. The first LED chip (C1) has a thickness ($T_{21}$) which is the greatest and is preferably greater than 200 µm. For example, the first LED chip (C1) may have a thickness ($T_{21}$) ranging from 200 µm to 400 µm. The second LED chip (C2) has a thickness ($T_{22}$) that is less than the thickness ($T_{21}$) of the first LED chip (C1). The thickness ($T_{21}$) of the second LED chip (C2) is preferably under 250 µm. For example the second LED chip (C2) may have a thickness ranging from 100 µm to 200 µm. It is advantageous for the first and second LED chips (C1, C2) to have a difference in thickness that is greater than 50 µm. The ESD protection component (C3) has a thickness ($T_{ESD}$) that is under 100 µm. It is advantageous for the ESD protection component (C3) to have a thickness that is as thin as possible. In one variation of the fifth embodiment, the first LED chip (C1) has a thickness ($T_{21}$) that is 250±50 µm, the second LED chip has a thickness ($T_{22}$) that is 150±30 µm, and the ESD protection component (C3) has a thickness that is 80±10 µm. In the fifth embodiment, by virtue of the different thicknesses of the LED chips, the light exit sites of the LED chips may be staggered from each other, and the light emission efficiency of the light emitting device may be improved.

The encapsulation layer 340 covers the first LED chip (C1), the second LED chip (C2), the ESD protection component (C3), and the patterned conductive layer 330 surrounding the first LED chip (C1), the second LED chip (C2) and the ESD protection component (C3). The encapsulation layer 340 has a peripheral edge that is level with a peripheral edge of the package substrate 310. The encapsulation layer 340 preferably includes fluorine resin and has a thickness ($T_{30}$) that is no greater than 1.5 times the thickness ($T_{21}$) of the first LED chip (C1). When the encapsulation layer 340 has a thickness ($T_{30}$) that is between 1.5 to 1.2 times the thickness ($T_{21}$) of the first LED chip (C1), the optical structure corresponding to the first LED chip (C1) may be well formed on the encapsulation layer 340, and the encapsulation layer 340 may have good bonding with the packaging substrate 310.

Referring to FIGS. 13 and 14, the encapsulation layer 340 forms an optical structure that corresponds to the first LED chip (C1) in position. The optical structure has a lateral curved surface S342 that covers a side wall of the first LED chip (C1). Additionally, a bottom terminating end 341 of the lateral curved surface S342 is preferably located above two thirds the thickness ($T_{21}$) of the first LED chip, and below an upper surface of the first LED chip (C1), or slightly above the upper surface of the first LED chip (C1). The bottom terminating end 341 is preferably located less than 50 µm above the upper surface of the first LED chip (C1), and even more preferably less than 20 µm. Such an arrangement finds a good compromise between producing a desirable light intensity distribution and having a high light extraction efficiency for the light emitting device. In this embodiment, the bottom terminating end 341 is basically level with the upper surface of the first LED chip (C1), and the optical structure corresponding in position to the first LED chip (C1) has a yurt-like shape. The encapsulation layer 340 has the planar region 342 that extends to the edge of the package substrate 310, and is level with the edge of the package substrate 310. The encapsulation layer 340 further includes an elevated curved region 343 covering the first LED chip (C1). The elevated curved region 343 has a top surface S343 that is generally flat. A difference in thickness between the planar region 342 and the elevated curved region 343 is preferably below 20 µm, which is conducive for the first LED chip (C1) to form a gently sloping lateral curved surface S342 surrounding an outer periphery of the first LED chip (C1).

In the fifth embodiment, two LED chips are provided to emit different wavelengths of light on the same light emitting device. Therefore, the light emitting device may fulfil two separate functional demands. Additionally, the lower wavelength high energy emitting LED chip is placed near the center of the light emitting device and has a greater thickness which helps to improve the light emission efficiency in multiple-chip LED light emitting devices.

The fifth embodiment has similarities with the second embodiment, the patterned conductive layer 330 is located on top of the first surface of the package substrate 310 and has a series of auxiliary trenches located on a peripheral area of the patterned conductive layer 330. The auxiliary trenches preferably have a depth that is half the thickness of the patterned conductive layer 330. The encapsulation layer 340 fills the auxiliary trenches and thereby increases bonding between the encapsulation layer 340 and the package substrate 310.

Figure 15:
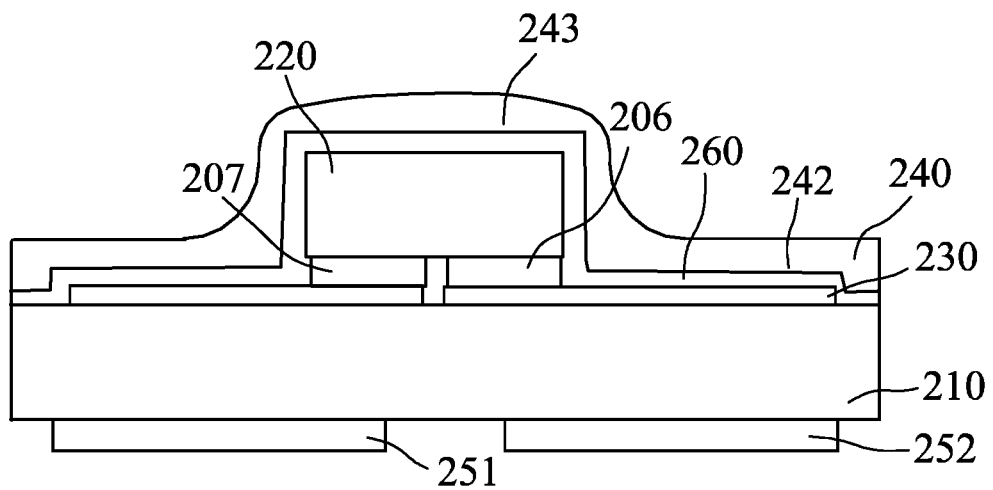
FIG. 15 is a schematic cross-sectional view of a sixth embodiment of the light emitting device according to the present disclosure.

FIG. 15 shows a sixth embodiment of the light emitting device according to the present disclosure. The sixth embodiment is similar to the first embodiment, with the following differences: the light emitting device includes a packaging protection layer 260 that covers the upper surface of the LED chip 220, the side wall of the LED chip 220, and a portion of the first surface of the packaging substrate 210; and the encapsulation layer 240 disposed on the packaging protection layer 260.

More specifically, the packaging protection layer 260 covers all exposed surfaces and side walls of the LED chip 220 except one side of the LED chip 220 that has a first electrode 206 and a second electrode 207. Additionally, the packaging protection layer 260 covers exposed parts of the first surface of the package substrate 210 except an area where it contacts the first and second electrodes 206, 207.

In some embodiments, the packaging protection layer 260 is made from an insulating material such as $SiO_2$, $HfO_2$ or $MGF_2$, etc. The packaging protection layer 260 may be formed through a deposition process on the first surface of the packaging substrate 210 and the upper surface and side wall of the LED chip 220. The method of deposition may be plasma enhanced chemical vapor deposition (PECVD), atomic layer deposition (ALD), sputtering, or any other method of deposition. The packaging protection layer 260 has good bonding with the package substrate 210 and the LED chip 220, which prolongs service life. The packaging protection layer 260 is made with an insulating material that has high hardness properties which helps to protect the LED chip 220.

The packaging protection layer 260 has a thickness that can be easily controlled during its formation. The packaging protection layer 260 is usually formed to have a thickness on the nanometer scale, for example, from tens of nanometers to hundreds or thousands of nanometers. A thinner packaging protection layer 260 facilitates the cooling of the LED chip 220, and increases the service life of the light emitting device. Additionally, because the packaging protection layer 260 includes oxides such as the previously mentioned $SiO_2$, $HfO_2$ or $MgF_2$, it has better UV and UVC transmission properties. Even under prolonged exposure to UV light the packaging protection layer 260 will not experience cracking or photodegradation. In this embodiment, the packaging protection layer 260 is directly deposited on the package substrate 210 which effectively protects the package substrate 210 (from moisture or oxidation). Additionally the patterned conductive layer 230 located on top of the first surface of the package substrate 210 has high UV and UVC transmission which decreases light absorption by the package substrate 210 and increase the light emission intensity of the light emitting device.

By virtue of having the packaging protection layer 260 being located between the encapsulation layer 240 and the LED chip 220, and on the first surface of the packaging layer 210, and by the packaging protection layer 260 including inorganic and electrically insulating materials, the LED chip 220 may be protected from moisture damage, the thickness ($T_{30}$) of the encapsulation layer 240 may be decreased, and the light emitting device may have good heat dissipation properties. In this embodiment, the encapsulation layer 240 has a thickness that is preferably less than 300 μm; for example, the encapsulation may have a thickness that is between 150 μm to 250 μm.

Figure 16:
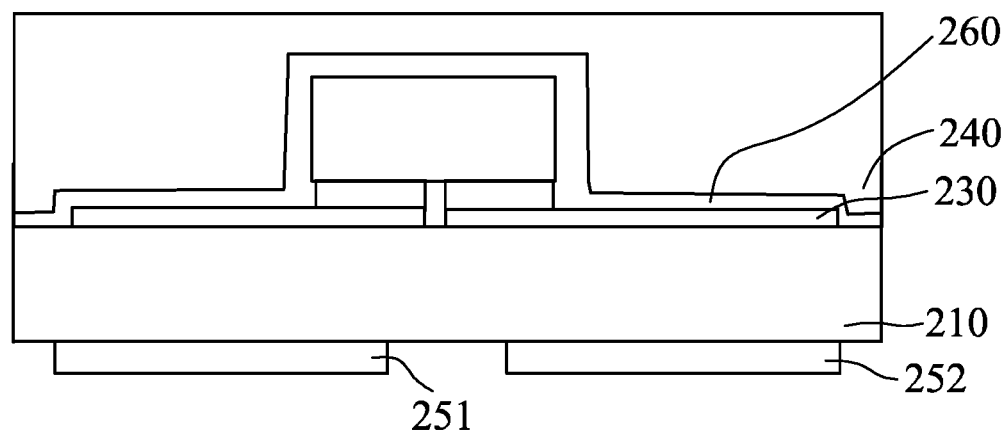
FIG. 16 is a schematic cross-sectional view of a variant of the sixth embodiment.

Although the sixth embodiment of the light emitting device shown in FIG. 15 includes the encapsulation layer 240 that forms an optical structure corresponding to the LED chip 220 in position. In other embodiments of the light emitting device, the encapsulation layer 240 may cover the LED chip 220 but not form an optical structure. For example, the encapsulation layer 240 may be pressure molded into rectangular formations as shown in FIG. 16.

Figure 17:
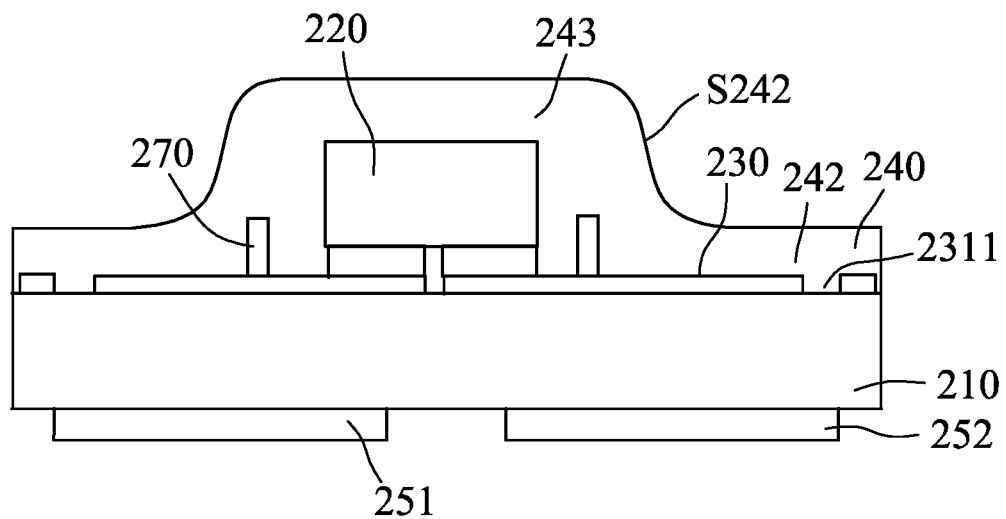
FIG. 17 is a schematic cross-sectional view of a seventh embodiment of the light emitting device according to the present disclosure.
Figure 18:
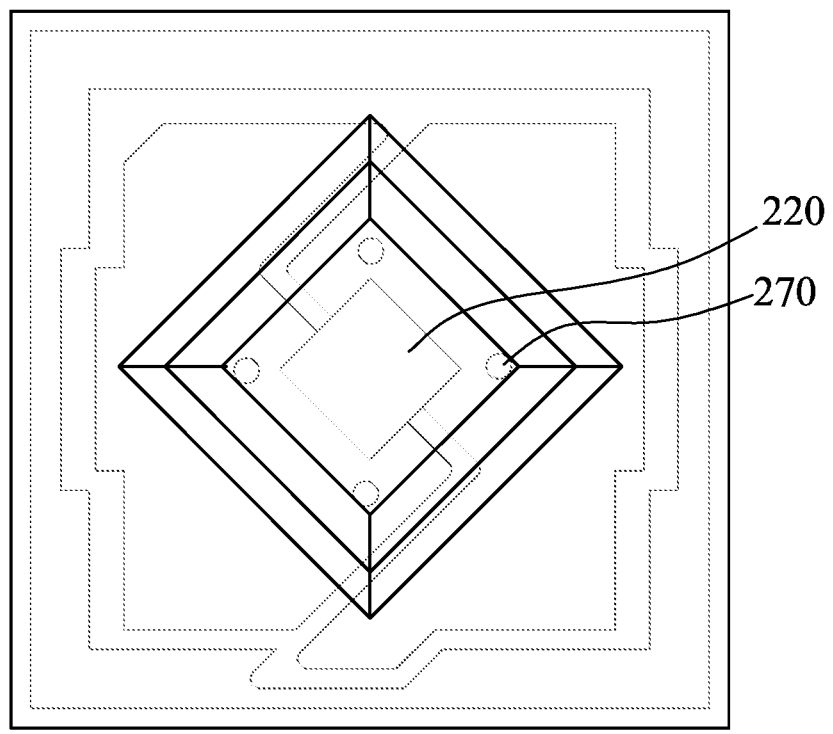
FIG. 18 is a schematic top view of the seventh embodiment.

FIGS. 17 and 18 show a seventh embodiment of the light emitting device. The seventh embodiment is similar to the first embodiment; however, the seventh embodiment has multiple protruding column 270. The protruding columns 270 are disposed in the die bonding area 232 and spaced circumferentially around the LED chip 220. Each protruding column 270 has a height that is less than the thickness of the LED chip 220, and portions of the encapsulation layer 240 above the protruding columns 270 have a gently sloped lateral curved surface S242.

More specifically, because the protruding columns 270 are disposed around the LED chip 220, and a portion of the elevated curved region 243 of the encapsulation layer 240 above the protruding columns 270 has a gentle slope, stresses imposed by the LED chip 220 upon portions of the encapsulation layer 240 covering corners of the side wall and the upper surface of the LED chip 220 may be reduced, possible cracking and breakage in these areas over prolonged use may be prevented, and bonding strength between the LED chip 220 and the encapsulation layer 240 and airtight encapsulation of the LED chip 220 may be improved.

Referring to FIGS. 17 and 18, in the seventh embodiment, the protruding columns 270 and the LED chip 220 form a symmetric configuration. The protruding columns 270 are circumferentially arranged around the LED chips 220 and spaced from the LED chip by a predetermined distance. The protruding columns 270 have a height that is preferably greater than one third of the thickness ($T_{20}$) of the LED chip 220, and preferably less than two thirds the thickness ($T_{20}$) of the LED chip 220. This ensures that the encapsulation layer 240 has a suitable thickness at areas above corners of the side wall and the upper surface of the LED chip 220, and prevents cracking in these areas of the encapsulation layer 240 over prolonged use.

If the protruding columns 270 have a height that is less than one third of the thickness ($T_{20}$) of the LED chip 220, the encapsulation layer 240 will be too thin at the areas above corners of the side wall and the upper surface of the LED chip 220, and will be more likely to crack over prolonged use. If the protruding columns 270 have a height that is greater than two thirds of the thickness ($T_{20}$) of the LED chip 220, the protruding columns 270 may block light emission from the side wall of the LED chip 220, and effect the light emission efficiency of the LED chip 220. Therefore, the height of the protruding columns 270 should be selected to compliment the thickness ($T_{20}$) of the LED chip 220, in order to reduce the chances of cracks forming in the encapsulation layer 240 while not compromising the light emission efficiency of the LED chip 220.

In some embodiments, each of the protruding columns 270 is at a minimum distance of between 10 μm to 300 μm away from the LED chip 220. If the minimum distance between a protruding column and the LED chip 220 is too small, the LED chip 220 will be too close to the protruding columns 270 and cause the areas of the encapsulation layer 240 above the corners of the side wall and the upper surface of the LED chip 220 to be relatively steep and hinder the formation of a gently sloping lateral curved surface S242. In this case, the stress imposed by the LED chip upon the areas of the encapsulation layer 240 above the corners of the side wall and the upper surface of the LED chip 240 may not be effectively relieved, and cracks may form in the encapsulation layer 240 at these areas after prolonged use. If the minimum distance between a protruding column and the LED chip 220 is too large, these areas of the encapsulation layer 240 will be too thick and affect light emission from the LED chip. In this case, the light emission efficiency of the LED chip will be adversely affected. In summary, the protruding columns 270 should be located at a suitable distance away from the LED chip 220 in order to decrease the chances of crack formation in the encapsulation layer 240 while not compromising the light emission efficiency of the LED chip 220.

In some embodiments, the minimum distance between each protruding column 270 and the LED chip 220 ranges from 50 μm to 100 μm. In other embodiments, the minimum distance between each protruding column 270 and the LED chip 220 ranges from 100 μm to 200 μm.

In some embodiments, the protruding columns 270 are cylindrical columns.

In some embodiments, the encapsulation layer 240 has a thickness (T30) that is 250 μm, and the minimum distance between the protruding column 270 and the LED chip 220 ranges from 30 μm to 100 μm. More specifically, the minimum distance between each protruding column 270 and the LED chip 220 is 80 μm or 100 μm.

It should be noted that values for the minimum distance between the protruding column 270 and the LED chip 220 as described above are merely exemplary, and the disclosure is not limited to the specific values given above. Indeed, any minimum distance that may help achieve the goal of decreasing the mechanical stress at the areas of the encapsulation layer 240 above the corners of the side wall and the upper surface of the LED chip 240 is within the bounds of the present disclosure.

In some embodiments, the LED chip 220 has a square structure as shown in FIG. 18, and each protruding column 270 is located at a point on a diagonal line of the LED chip 220. The minimum distance of each protruding column 270 from the corresponding corner of the LED chip 220 along the diagonal line ranges from 10 μm to 300 μm, preferably from 50 μm to 100 μm or from 100 μm to 200 μm.

In another variation of the embodiment, the LED chip 220 is a cylindrical structure, and four protruding columns 270 are arranged circumferentially around the LED chip 220 at equal intervals. The four protruding columns 270 have a minimum distance ranging from 50 μm to 100 μm to the LED chip 220. In some other embodiments, the minimum distance may be from 50 μm to 100 μm, or from 100 μm to 200 μm.

In this embodiment, by virtue of the protruding columns 270 being disposed around the LED chip 220, and the encapsulation layer 240 forming a gently sloped lateral curved surface S242, the mechanical stress imposed by the LED chip upon the areas of the encapsulation layer 240 above the corners of the side wall and the upper surface of the LED chip 240 is lessened, and the likelihood of cracks forming on these areas of the encapsulation layer 240 after prolonged use is lessened. The encapsulation of the LED chip 220 by the encapsulation layer 240 is strengthened which offers airtight encapsulation of the LED chip 220.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light emitting device comprising:
a package substrate having a first surface and a second surface that is opposite to said first surface;
a patterned conductive layer located on top of said first surface, and having an isolation region that separates said patterned conductive layer into at least a first region and a second region that are electrically insulated from each other;
an LED chip located on top of said patterned conductive layer and having an upper surface, a lower surface opposite to said upper surface, a side wall, a first electrode disposed on said lower surface, and a second electrode disposed on said lower surface, said first electrode being electrically connected to said first region of said patterned conductive layer, said second electrode being electrically connected to said second region of said patterned conductive layer; and
an encapsulation layer covering said LED chip and said patterned conductive layer, wherein said encapsulation layer forms an optical structure that corresponds to said LED chip in position, said optical structure having a lateral curved surface that corresponds in position to a side wall of said LED chip; and wherein, when light emitted from said LED chip radiates through said optical structure of said encapsulation layer, the light emitting device has a viewing angle exceeding 120°,
wherein said isolation region includes a first isolation section that extends along a periphery of said package substrate on an outer peripheral area of said first surface, and that separates said patterned conductive layer into a die bonding area and a border area, and a second isolation section that is located in said die bonding area, and that separates said die bonding area into a first region and a second region,
wherein said second isolation section includes a first segment, a second segment, and a third segment, said second segment and said third segment respectively extend inwardly from two opposite sides of said die bonding area that are adjacent to said border area, said second segment and said third segment are parallel and offset and extend in a first direction, said first segment extends along a second direction intersecting the first direction and interconnects said second segment and the third segment, and wherein said LED chip is located on top of said first segment, said second segment, and said third segment.

2. The light emitting device as claimed in claim 1, wherein a thickness of a portion of said encapsulation layer covering said upper surface of said LED chip is no greater than a thickness of said LED chip.

3. The light emitting device as claimed in claim 2, wherein:

said encapsulation layer further has a planar region that covers a portion of said patterned conductive layer surrounding said LED chip;

said encapsulation layer has a first thickness directly above a center of said LED chip, and a second thickness above a periphery of said LED chip, said planar region of said encapsulating layer having a third thickness; and said first thickness, said second thickness, and said third thickness have the relation: $400\ \mu m \geq T_{33} \geq T_{31} \geq T_{32} \geq 100\ \mu m$, wherein $T_{33}$ represents said third thickness, $T_{31}$ represents said first thickness, and $T_{32}$ represents said second thickness.

4. The light emitting device as claimed in claim 3, wherein said first thickness, and said third thickness have the relation: $0\ \mu m \leq T_{33}-T_{31} \geq 50\ \mu m$, wherein $T_{33}$ represents said third thickness, and $T_{31}$ represents said first thickness.

5. The light emitting device as claimed in claim 3, wherein said thickness of said LED chip and said first thickness have the relation: $1.2 \times T_{20} \geq T_{31} \geq 0.5 \times T_{20}$, and $0\ \mu m \leq T_{31}-T_{32} \leq 50\ \mu m$, wherein $T_{20}$ represents said thickness of said LED chip, $T_{31}$ represents said first thickness $T_{31}$, and $T_{32}$ represents said second thickness.

6. The light emitting device as claimed in claim 3, wherein:

Said thickness of said LED chip and said first thickness have the relation: $150\ \mu m \leq T_{31} \leq T_{20}$, wherein $T_{31}$ represents said first thickness $T_{31}$, and $T_{20}$ represents said thickness of said LED chip; and said first thickness and said second thickness has the relation: $0\ \mu m < T_{31}-T_{32} \leq 100\ \mu m$, wherein $T_{31}$ represents said first thickness, and $T_{32}$ represents said second thickness.

7. The light emitting device as claimed in claim 1, wherein:

said optical structure further has a top surface that is located directly above said upper surface of said LED chip; and an inclining angle of said top surface of said optical structure with respect to a plane parallel to said upper surface of said LED chip is between 0° to 40°.

8. The light emitting device as claimed in claim 1 wherein:

said encapsulation layer further has a planar region that covers a portion of said patterned conductive layer surrounding said LED chip, said planar region having a thickness that is no greater than 1.5 times said thickness of said LED chip.

9. The light emitting device as claimed in claim 1 wherein:

said thickness of said LED chip is no greater than 300 μm; and said thickness of said encapsulation layer above said upper surface of said LED chip is no greater than 4/5 times said thickness of said LED chip.

10. The light emitting device as claimed in claim 1 wherein:

said thickness of said LED chip is no greater than 300 μm; and said thickness of said encapsulation layer above said upper surface of said LED chip is no less than half said thickness of said LED chip and no greater than said thickness of said LED chip.

11. The light emitting device as claimed in claim 1, wherein, said thickness of said encapsulation layer above said upper surface of said LED chip is no less than 100 μm, but less than 200 μm, or no less than 200 μm but less than 300 μm, or no less than 300 μm but less than 400 μm.

12. The light emitting device as claimed in claim 1, wherein, a thickness of said encapsulation layer covering said side wall of said LED chip gradually decreases from a bottom to a top of said side wall.

13. The light emitting device as claimed in claim 1, wherein said thickness of said encapsulation layer covering said upper surface of said LED chip is less than said thickness of said LED chip, and a portion of said encapsulation layer covering a part of said side wall of said LED chip adjacent to said upper surface of said LED chip has a minimum thickness, which is ≥100 μm.

14. The light emitting device as claimed in claim 1, wherein:

said encapsulation layer further includes a planar region covering said patterned conductive layer, and an elevated curved region connected to said planar region, said elevated curved region forming said optical structure, covering said LED chip, and having said lateral curved surface, a distance measured from an intersection of said elevated curved region of said optical structure and said planar region to said side wall of said LED chip is 1 to 2 times the thickness of said LED chip.

15. The light emitting device as claimed in claim 1, wherein:

said encapsulation layer forms a lower portion surrounding an outer periphery of said LED chip, and a higher portion above said upper surface of said LED chip; and said lateral curved surface of said optical structure includes a first curved surface that connects with said lower portion of said encapsulation layer, and a second curved surface that connects with said higher portion of said encapsulation layer.

16. The light emitting device as claimed in claim 15, wherein said first curved surface covers said side wall of said LED chip and is proximate to said planar region.

17. The light emitting device as claimed in claim 15, wherein said second curved surface has a first end that directly connects a top of said first curved surface and a second end that is located above said upper surface of said LED chip.

18. The light emitting device as claimed in claim 1, wherein:

said isolation region of said patterned conductive layer located on top of the first surface of said package substrate has a trench like structure; and said encapsulation layer fills the isolation region.

19. The light emitting device as claimed in claim 18, wherein:
    said isolation region has a plurality of corners, at least one of said corners having an angle that is less than 90°.

20. The light emitting device as claimed in claim 1, wherein said first isolation section has a closed loop configuration.

\* \* \* \* \*